United States Patent [19]

Schiffman

[11] Patent Number: 4,884,135

[45] Date of Patent: * Nov. 28, 1989

[54] APPARATUS FOR PROMOTING THE VIGILANCE OF A MOTOR VEHICLE OPERATOR

[76] Inventor: Julius Schiffman, 12960 LaSalle La., Huntington Woods, Mich. 48070

[*] Notice: The portion of the term of this patent subsequent to May 3, 2005 has been disclaimed.

[21] Appl. No.: 187,834

[22] Filed: Apr. 29, 1988

Related U.S. Application Data

[60] Division of Ser. No. 15,160, Feb. 17, 1987, Pat. No. 4,742,389, which is a continuation of Ser. No. 710,676, Mar. 12, 1985, abandoned.

[51] Int. Cl.⁴ .............................................. H04N 7/18
[52] U.S. Cl. ................................... 358/103; 358/250; 340/705; 340/980
[58] Field of Search ............... 358/103, 109, 250, 104, 358/93; 340/980, 705; 350/174

[56] References Cited

U.S. PATENT DOCUMENTS

| | | | |
|---|---|---|---|
| 4,001,499 | 1/1977 | Dowell | 350/109 X |
| 4,138,726 | 2/1979 | Girault et al. | 358/103 X |
| 4,153,913 | 5/1979 | Swift | 358/250 X |
| 4,635,033 | 1/1987 | Inukai et al. | 340/980 X |
| 4,742,389 | 5/1988 | Schiffman | 358/103 |

Primary Examiner—James J. Groody
Assistant Examiner—Victor R. Kostak
Attorney, Agent, or Firm—Krass & Young

[57] ABSTRACT

A device for maintaining the vigilance of a motor vehicle operator. Two preferred embodiments, maintaining the operator's attention toward the direction of developing traffic conditions, with a visual system focused at infinity, are disclosed. One shows an image which is projected or otherwise transmitted from below the normal line of sight of the operator, while the other illustrates transmission of the image from above the vehicle operator. The invention overcomes "road hypnosis" or other inattentiveness by maintaining the operator's interest, thereby putting the operator's psychological perceptive apparatus in a high state of readiness.

11 Claims, 2 Drawing Sheets

APPARATUS FOR PROMOTING THE VIGILANCE OF A MOTOR VEHICLE OPERATOR

The present application is a divisional application of U.S. patent application Ser. No. 07/015,160, filed Feb. 17, 1987, now U.S. Pat. No. 4,742,389 entitled "Apparatus for Promoting the Vigilance of a Motor Vehicle Operator", which is a continuation of U.S. patent application Ser. No. 06/170,575, filed Mar. 12, 1985, now abandoned.

FIELD OF THE INVENTION

This invention relates to motor vehicle safety systems and more particularly to an apparatus to attract the visual attention of a motor vehicle operator generally toward the direction of travel.

BACKGROUND INFORMATION

Operating a motor vehicle is a complicated task, demanding the use of visual and physical skills combined with the ability to make judgments rapidly. Quite clearly, a certain minimal level of physical skills is required to drive successfully. In most of the United States, this fact is recognized in that to receive a license, motor vehicle operators must first pass a vision test and then demonstrate these visual and physical skills in a driving test. On-the-road tests also force the person tested to demonstrate skills of judgment.

There are, however, certain skills or abilities that such tests simply do not measure. Among these is the ability of an operator to maintain vigilance with regard to ever-changing driving conditions.

Failure of operator vigilance frequently occurs during long highway trips and during shorter, more local, trips where the operator has come to expect certain driving conditions and driver behaviors. In both cases, this diminished attentiveness impairs the ability of the operator to react adequately to these changing conditions and may result in a traffic accident.

The importance of this problem has not been overlooked. A variety of approaches to monitoring and maintaining driver alertness have been developed. Among these is a class of devices which monitor steering wheel motions. When the pattern of steering wheel motions shows that the driver's attention level has gone below that considered to be safe, an alarm for regaining the attention of the driver is activated. Of course, the recent advent of high-mounted stoplights also has the purpose of attracting and maintaining the attention of drivers following a vehicle which is so equipped.

Driving a motor vehicle is a task which demands relatively more visual than auditory attention. This explains why a person can successfully drive an automobile and simultaneously listen to a radio program. Any events that divert a driver's visual attention from the outside surroundings ahead of the vehicle immediately increase the probability of the vehicle being involved in a mishap. An example of such an event is to encounter two vehicles that have collided, parked by the side of the road. The peripheral accidents that occur at such sites evidence the increased chances of being involved in a collision when an operator's attention is visually distracted.

As noted in "Hidden Visual Processes," Scientific American, Feb. 1983, p. 97, Drs. Herschel Leibowitz and D. Alfred Owens found that a human being, when deprived of any visual stimuli, will resort to a condition known as "dark focus." In this condition, the subject's visual system assumes a focal distance of approximately one meter. The "dark focus" phenomenon is believed to be an explanation for so-called "road hypnosis" experienced by many long distance drivers. To bring a person out of a state of "road hypnosis," it is necessary first to gain the attention of the individual, and then to give the person enough time to refocus visual attention. Under the circumstances, there may not be enough time to respond to an emergency.

Dr. Richard Restak reports on page 29 of "The Brain: The Last Frontier", Doubleday & Co., 1979, that experiments suggest that primates derive pleasure from observing complex situations involving color, brightness, and movement. Rhesus monkeys, when given the means, will create movies in preference to still photographs. Modern psychobiological research is showing that a human's response is strongly affected by and may even be dependent upon movement in the environment. This movement creates the novelty and stimulation, implying the greater information content, which primates seem to desire. To keep a vehicle operator stimulated to the point of maximal responsiveness, then, it is advantageous to present a moving visual image in the general direction requiring the greatest attention.

Further recent psychobiological research has been directed toward evoked-responses. These evoked response studies show that, as measured by a brain response which is known as the P300 wave, a human subject's interest is maintained at its highest state when unpredictable information is presented to the subject is presented with new information; the lack of new information brings about a diminished response of the P300 wave. One current theory relating to the P300 wave is that the existence of a P300 wave represents a decision-making activity within the cortex of the brain. A possible application of this psychological research of the P300 wave is to support the theory that aggressive people may be influenced to drive more safely through its use. The rationale for this theory is that aggressive behavior is often the result of an attempt by the vehicle operator to stimulate the evoked responses indicated by the P300 wave.

A driver whose visual system is already properly focused several carlengths ahead will obviously not have to refocus in order to respond to an emergency. As an aid to maintaining a properly focused visual system, the driver should be attracted to something at that distance.

Many persons have "watched" television, enjoying the program by occasionally looking at the television screen, while simultaneously performing another, primarily visual task, such as reading a newspaper. This is apparently possible because audio-visual programs typically rely primarily upon auditory channels to transfer information. The visual channels are used only for occasionally updating or confirming situations, or resolving ambiguities. In other words, an individual may enjoy an audio-visual program while spending only a small fraction of the time actually looking at it.

Since the time that they were first use in automobiles, radio receivers have served the dual purposes of providing entertainment and helping to maintain driver alertness. These purposes are served on long-distance trips as well as shorter commuter trips, where the tedium of congested traffic conditions can lead to driver inattentiveness. The recent introduction of audio cassette players to motor vehicles has given the driver an additional method of entertainment and maintaining alertness. It is quite clear that a significant degree of driver attention may be sustained solely through the human auditory system.

The experience of pilots flying aircraft equipped with head-up displays has shown that the ability of a properly trained pilot to fly an aircraft is not diminished when the pilot concurrently assimilates information presented by the head-up display. An important aspect of this phenomenon is that the pilot need not refocus when diverting attention from one task to another. This is true even though the fields of information may coincide with each other.

The apparatus for maintaining vigilance by attracting an operator's visual attention ahead of the vehicle with a head-up visual display and entertainment system whose images are focused at infinity will promote highway safety. When using such a system, the individual's focus of attention can alternate between a view of the road ahead and a display of visual information while improving driving performance.

SUMMARY OF THE INVENTION

The present invention is broadly directed toward the use of a head-up display for presenting the visual component of an audio-visual entertainment or education program to the operator of a motor vehicle. The visual images are focused at an infinite distance enabling the operator's visual system to react quickly to developing traffic conditions. With this system, the operator need not divert attention from the view ahead to read instrumentation within the vehicle. Most important, however, is the fact that the attention of an operator using such a system is far more likely to be directed ahead of the vehicle.

As disclosed in both of the following detailed descriptions of preferred embodiments, the visual display appears slightly above the angular level at which traffic conditions appear. Only a slight angular deviation is required to redirect the driver's attention from the visual display to the driving situation, and back. The display is transmitted to this position through any of a variety of transmissive means, including direct projection of the image and electronic transfer to a read-out device.

The source of this entertainment/education programming can be, among other things, broadcast television signals or prerecorded video cassettes being replayed on a video cassette player. The image may also contain relevant instrument readings or navigational information, such as maps.

BRIEF DESCRIPTION OF THE DRAWINGS

Preferred embodiments of the driver vigilance apparatus built in accordance with the present invention are disclosed in the following detailed descriptions. The descriptions make reference to the accompanying drawings in which.

FIG: 1 is a schematic drawing of a first embodiment of the apparatus of the present invention.

DETAILED DESCRIPTIONS OF THE PREFERRED EMBODIMENTS

Figure 1:
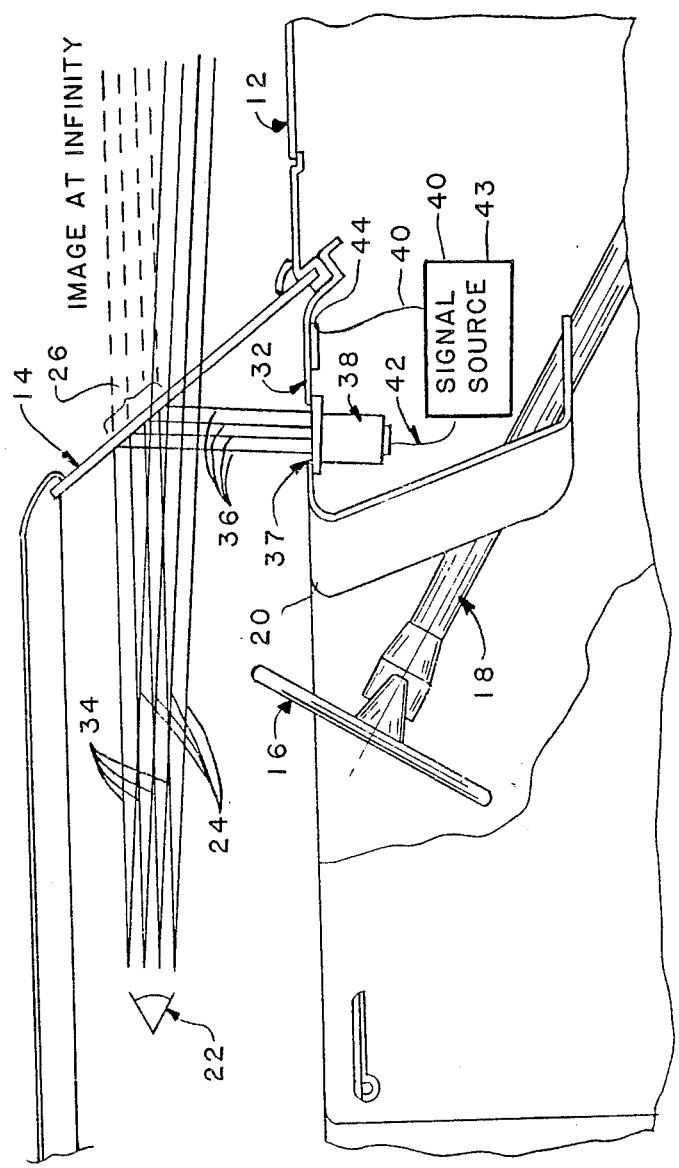

Referring now to FIG. 1 of the drawings, one preferred embodiment of the present invention can be appreciated. FIG. 1 shows a schematic drawing of a motor vehicle having a forward body panel 12, a relatively transparent windshield 14 made of glass, plastic or some substitutable material, and a steering wheel 16. The steering wheel is attached to a steering column 18 which passes forward through the dash panel 20.

The operator's eyes 22 are located at some relatively unchanging position with respect to the automobile components just mentioned. The view of the driving conditions ahead of the vehicle are presented to the operator's eyes 22 by means of light rays 24, which are shown cast at a slight downward angle toward the pavement upon which the automobile is driving. The light rays 24 composing the scene ahead of the vehicle pass through the windshield 14 virtually undistorted. A region 26 of the inner surface of windshield 14 is specially treated to act as a reflecting surface for light energy coming from below the inner surface of the windshield 14. For example, a dichroic mirror could be formed in region 26, placed so as to allow light energy striking region 26 from below to be reflected toward the operator's eyes 22, while transmitting, to eyes 22, the light rays which carry the information constituting the scene ahead of the vehicle.

It is clear then, that light rays 34 result from reflections of light energy from the inner surface 26 of windshield 14. The light rays 34 are collimated, presenting an image which appears to be approximately visual infinity. The image represented by rays 34 is produced by the reflection of the rays 36. These rays, in turn, result from collimation by collimator 37 of the light energy which emanates from a video display source 38, such as a cathode ray tube (CRT). The image is displayed on the front face of video display source 38, in accordance with signals sent to it by signal source 40. Signals produced by source 40 are passed to video display source 38 by means of a cable 42. Source 40 can be of any of a variety of devices. Chief among the choices are a television receiver with a receiving antenna, a video cassette recorder, electronic instrumentation for the vehicle, navigational systems, or combinations of these.

In this first preferred embodiment, then, source 40 may be a collection of signal sources from which a desired visual program may be selected, through some means 43 such as a switch. Program source 40 will also present audio signals to a speaker 44 through cable 46. Speaker 44 may be placed in any convenient position within the automobile, but is shown placed in dashboard 32 for convenience. Dashboard 32 also contains video display source 38.

Figure 2:
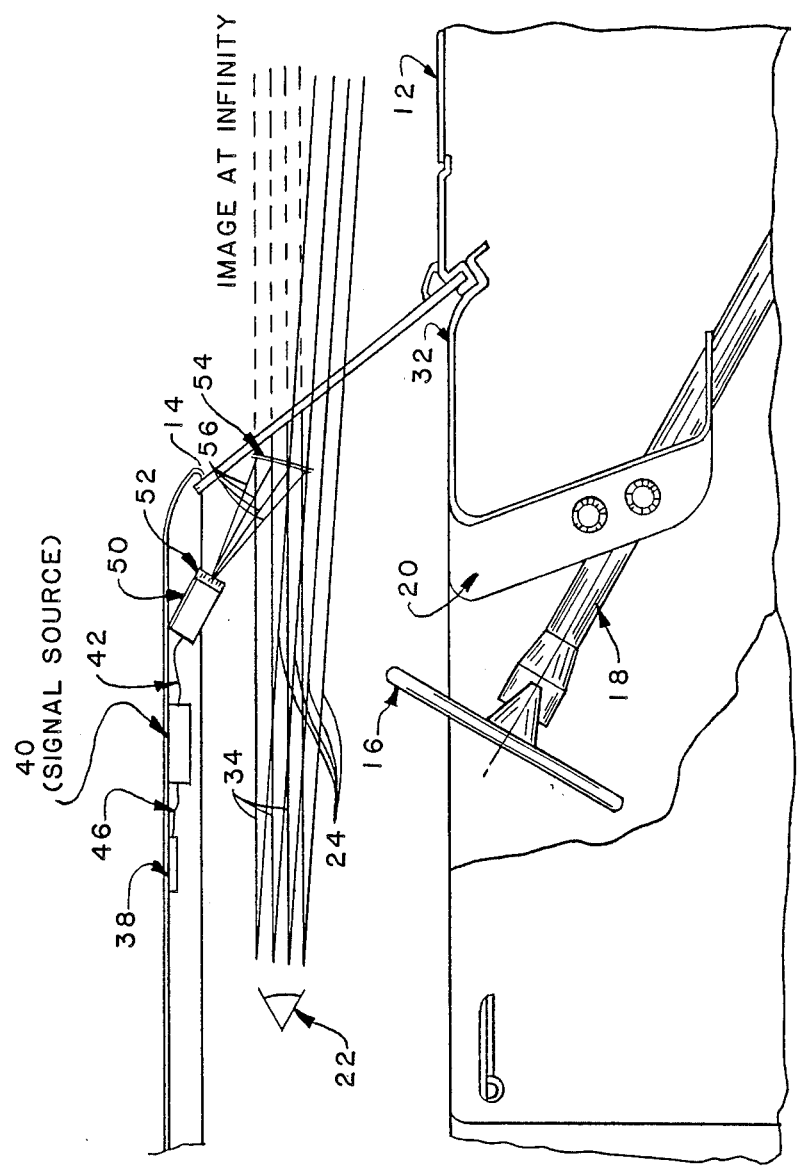
FIG. 2 is a schematic drawing of a second embodiment of the apparatus of the present invention.

Referring now to FIG. 2 of the drawings, where features common with those in FIG. 1 are given the same numerals, a second preferred embodiment of the present invention may be appreciated. In this preferred embodiment the image may be produced by projection device 50 having a projection lens 52 which casts an image in the form of a diverging wavefront toward optical element 54. As was shown in FIG. 1, the image of the view ahead is presented to the eyes 22 of the operator. The image passes through windshield 14 and is substantially collimated. A portion of the outside view may pass through optical element 54, necessitating that optical element 54 be capable of transmitting such a view. One means of accomplishing this task is to produce optical element 54 as a holographic optical element.

Optical element 54 also presents a collimated image 34 to the eyes 22 of the operator. Therefore, optical element 54 must be capable of transforming the diverging image 56 to the collimated image 34. Program source 40 can be any of a number of audio-visual sources, such as broadcast television or video cassette recorded images. The video image produced by source 40 is carried to projector 50 by means of a cable 42. Likewise source 40 can produce an audio signal which is presented to speakers 38, here shown in the roof, but locatable any convenient place within the automobile, by line 46.

Both embodiments, shown in FIG. 1 and FIG. 2, present images, focused at infinity, and located slightly above the line of sight toward developing traffic conditions in front of the vehicle. The production of these images is intended to maintain driver alertness while driving under tedious or boring conditions.

It is not necessary that the display of either preferred embodiment utilize any more than a small fraction of total windshield area, while maintaining its ability to display all of the information contained in a television picture. The human brain has learned to compensate for the variety of sizes of television screens. This fact is attested to by the popularity of miniaturized television sets having one-inch screens. This adaptability is explained by an effect which psychologists term "size constancy."

Size constancy explains why the perceived size of the moon is greater when it is near the horizon than when it is higher in the sky, even though its size is actually unchanged. There are two theories to explain this effect: either the human brain (1) perceives the sky above to be closer than the horizon and, in compensating for this perceived difference, sees the moon to be bigger then it really should or the brain (2) estimates the size of the moon based on the emptiness of the surrounding areas, so that the existence of other features on the horizon causes the moon to appear bigger. Because the human brain which has experienced artificial visual presentation of images has become accustomed to this method of presenting information, it can, to a large degree, compensate for the actual image shown by the head-up display.

The intensity of the displayed image can be varied, either manually or automatically, so as to maintain an optimal relative contrast of the displayed image to the image of the view ahead.

The visual display can take the form of a combiner, thereby allowing images from both the audio/visual program and the outside world to be overlaid in the same apparent direction.

If the means for stimulating the evoked responses exemplified by the P300 wave can be shifted to a visual display system, the driving habits of the vehicle operator may be substantially mollified.

It has been the experience of the applicant that operating a vehicle equipped with a visual display such as the subject of this application in fact promotes highway safety by maintaining the driver in a heightened state of awareness while simultaneously performing the primary function of operating the motor vehicle.

While an appreciation of the present invention may be acquired through illustration of the two embodiments just described in detail, these disclosures are not intended to serve as limitations in any way. The full scope of the present invention may be appreciated by one skilled in the art. This application is intended to cover all such embodiments, whose scope is defined by the following claims.

I claim:

1. An apparatus for use in a ground vehicle having a windshield through which a driver may view conditions in the direction of travel of the ground vehicle, the apparatus comprising:
   a signal source for generating a video signal comprising a series of moving visual images constituting a visual program of unpredictable, new information unrelated to the operation of the ground vehicle; and
   a visual display means connected to said signal source for presenting a visual display of said video signal, the visual display means including
      a video display source connected to said signal source for emitting light corresponding to said video signal, and
      a reflecting device having an area, which is a small fraction of the total windshield area and disposed on the windshield in a position slightly above the line of sight of the driver toward the direction of travel of the ground vehicle for reflecting the light emitted by said video display source to the driver,
   whereby the driver can observe said visual display while operating the ground vehicle and such observation will maintain the field of view of the driver in the proper position for operation of the ground vehicle and will maintain the driver in a mental state of vigilance.

2. The apparatus as claimed in claim 1, wherein said video display source is a cathode ray tube.

3. The apparatus as claimed in claim 1, wherein said video display source is disposed below the windshield to emit light upward to said reflecting device.

4. The apparatus as claimed in claim 1, wherein said video display source is disposed above the reflecting device to emit light downward to said reflecting device.

5. An apparatus for use in a ground vehicle having a windshield through which a driver may view conditions in the direction of travel of the ground vehicle, the apparatus comprising:
   means for displaying to the driver visual images, said visual images disposed in a position slightly above the line of sight of the driver toward the direction of travel of the ground vehicle;
   whereby the driver can observe said visual images while operating the ground vehicle and such observation will maintain the field of view of the driver in the proper position for operation of the ground vehicle.

6. The apparatus of claim 5, wherein:
said visual images consist of map displays.

7. The apparatus of claim 5, wherein:
said visual images consist of instrument readings for the ground vehicle.

8. The apparatus of claim 5, wherein:
said visual images displayed to the driver are collimated.

9. The apparatus of claim 5, further comprising:
means for producing audio programs corresponding to said visual images, whereby the driver can observe said visual images and hear said corresponding audio program.

10. An apparatus for use in a ground vehicle having a windshield through which a driver may view conditions in the directions of travel of the ground vehicle, the apparatus comprising:
   means for displaying to the driver visual images, said visual images utilizing a small fraction of the total windshield area and disposed in a position slightly above the line of sight of the driver toward the direction of travel of the ground vehicle;

whereby the driver can observe said visual images while operating the ground vehicle and such observation will maintain the field of view of the driver in the proper position for operation of the ground vehicle.

11. An apparatus for use in a ground vehicle having a windshield through which a driver may view conditions in the direction of travel of the ground vehicle, the apparatus comprising:

means for displaying to the driver visual images, said visual images consisting of a series of moving visual images constituting a visual program of unpredictable, new information, utilizing a small fraction of the total windshield area and disposed in a position slightly above the line of sight of the driver toward the direction of travel of the ground vehicle;

whereby the driver can observe said visual images while operating the ground vehicle and such observation will maintain the field of view of the driver in the proper position for operation of the ground vehicle and will maintain the driver in a mental state of vigilance.

* * * * *